US012750604B2

(12) United States Patent
Suess et al.

(10) Patent No.: US 12,750,604 B2
(45) Date of Patent: Sep. 29, 2026

(54) HYBRID IMAGING SENSOR WITH SHARED READOUT

(71) Applicant: OMNIVISION TECHNOLOGIES, INC., Santa Clara, CA (US)

(72) Inventors: Andreas Suess, San Jose, CA (US); Sangjoo Lee, Santa Clara, CA (US); Rui Wang, San Jose, CA (US); Hiroaki Ebihara, San Jose, CA (US); Eiichi Funatsu, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 34 days.

(21) Appl. No.: 18/918,813

(22) Filed: Oct. 17, 2024

(65) Prior Publication Data

US 2025/0193555 A1 Jun. 12, 2025

Related U.S. Application Data

(60) Provisional application No. 63/608,150, filed on Dec. 8, 2023.

(51) Int. Cl.
*H04N 25/77* (2023.01)
*H04N 23/667* (2023.01)
(Continued)

(52) U.S. Cl.
CPC ........... *H04N 25/77* (2023.01); *H04N 23/667* (2023.01); *H04N 25/11* (2023.01); *H04N 25/134* (2023.01);
(Continued)

(58) Field of Classification Search
CPC ...... H04N 25/77; H04N 23/667; H04N 25/11; H04N 25/134; H04N 25/135; H04N 25/42;
(Continued)

(56) References Cited

U.S. PATENT DOCUMENTS

| | | | |
|---|---|---|---|
| 8,780,240 B2 | 7/2014 | Posch et al. |
| 9,544,513 B2 | 1/2017 | Shin et al. |

(Continued)

FOREIGN PATENT DOCUMENTS

| | | |
|---|---|---|
| WO | 2021159231 A1 | 8/2021 |
| WO | 2023106232 A1 | 6/2023 |

(Continued)

OTHER PUBLICATIONS

European Search Report received in EP App No. 24212229.9 dated Jan. 29, 2025, pp all.

(Continued)

*Primary Examiner* — Shahbaz Nazrul
(74) *Attorney, Agent, or Firm* — Dorsey & Whitney LLP

(57) ABSTRACT

A pixel circuit includes a pixel array and a color filter. The pixel array includes a plurality of pixels arranged in rows and columns, each pixel including four photodiodes, a floating diffusion, and four transfer transistors. The color filter array includes a plurality of color filters each having one of a plurality of colors and disposed over at least one of the pixels. Each of the plurality of pixels is coupled to a first readout circuit, and the plurality of pixels includes (i) a first subset of the pixels not coupled to a second readout circuit and (ii) a second subset of the pixels coupled to the second readout circuit. Floating diffusions of two diagonally arranged pixels are coupled together, and the two diagonally arranged pixels coupled together are disposed underneath color filters of a same color.

20 Claims, 6 Drawing Sheets

(51) Int. Cl.

| | |
|---|---|
| ***H04N 25/11*** | (2023.01) |
| ***H04N 25/13*** | (2023.01) |
| ***H04N 25/42*** | (2023.01) |
| ***H04N 25/47*** | (2023.01) |
| ***H04N 25/621*** | (2023.01) |
| ***H04N 25/78*** | (2023.01) |
| ***H04N 25/79*** | (2023.01) |
| ***H10F 39/00*** | (2025.01) |
| ***H10F 39/18*** | (2025.01) |

(52) U.S. Cl.
CPC ........... *H04N 25/135* (2023.01); *H04N 25/42* (2023.01); *H04N 25/47* (2023.01); *H04N 25/621* (2023.01); *H04N 25/78* (2023.01); *H10F 39/182* (2025.01); *H10F 39/8023* (2025.01); *H10F 39/8053* (2025.01); *H10F 39/8063* (2025.01); *H04N 25/79* (2023.01)

(58) Field of Classification Search
CPC ...... H04N 25/47; H04N 25/621; H04N 25/78; H04N 25/79; H04N 25/704; H04N 25/778; H04N 25/46; H10F 39/182; H10F 39/8023; H10F 39/8053; H10F 39/8063
See application file for complete search history.

(56) References Cited

U.S. PATENT DOCUMENTS

| | | | | |
|---|---|---|---|---|
| 9,961,291 | B2 | 5/2018 | Chen | |
| 11,218,659 | B2 | 1/2022 | Xu et al. | |
| 11,240,449 | B2 | 2/2022 | Mostafalu et al. | |
| 11,240,454 | B2 | 2/2022 | Gao et al. | |
| 11,272,133 | B1 | 3/2022 | Zhang et al. | |
| 11,280,918 | B2 | 3/2022 | Nishihara et al. | |
| 11,706,543 | B2 | 7/2023 | Xu et al. | |
| 12,101,563 | B2 | 9/2024 | Wang et al. | |
| 12,442,901 | B2 * | 10/2025 | Suess | G01S 7/4861 |
| 2003/0127672 | A1 | 7/2003 | Rahn et al. | |
| 2010/0141812 | A1 | 6/2010 | Hirota | |
| 2010/0214460 | A1 | 8/2010 | Hasegawa et al. | |
| 2010/0295981 | A1 | 11/2010 | Morimoto | |
| 2013/0088625 | A1 | 4/2013 | Iwata et al. | |
| 2013/0181117 | A1 | 7/2013 | Shimizu et al. | |
| 2015/0002635 | A1 | 1/2015 | Kawai et al. | |
| 2015/0077609 | A1 | 3/2015 | Okamoto et al. | |
| 2015/0201118 | A1 | 7/2015 | Lee et al. | |
| 2015/0256777 | A1 | 9/2015 | Ishii et al. | |
| 2016/0353034 | A1 | 12/2016 | Mauritzson et al. | |
| 2017/0125464 | A1 | 5/2017 | Abe et al. | |
| 2017/0127002 | A1 | 5/2017 | Eshel et al. | |
| 2018/0190699 | A1 | 7/2018 | Lee et al. | |
| 2020/0007808 | A1 | 1/2020 | Jung et al. | |
| 2020/0084403 | A1 | 3/2020 | Suh et al. | |
| 2020/0244913 | A1 | 7/2020 | Jung et al. | |
| 2020/0358971 | A1 | 11/2020 | Shim et al. | |
| 2021/0067100 | A1 | 3/2021 | Choi et al. | |
| 2021/0074745 | A1 | 3/2021 | Mi et al. | |
| 2021/0084246 | A1 | 3/2021 | Mostafalu et al. | |
| 2021/0099656 | A1 | 4/2021 | Cho et al. | |
| 2021/0168314 | A1 | 6/2021 | Mehta et al. | |
| 2021/0176417 | A1 | 6/2021 | Xu et al. | |
| 2021/0185264 | A1 | 6/2021 | Wong et al. | |
| 2021/0320140 | A1 | 10/2021 | Kitano et al. | |
| 2021/0377473 | A1 | 12/2021 | Sano et al. | |
| 2021/0399689 | A1 | 12/2021 | Choi et al. | |
| 2021/0400223 | A1 | 12/2021 | Kitano et al. | |
| 2022/0021835 | A1 | 1/2022 | Suh et al. | |
| 2022/0038645 | A1 | 2/2022 | Takahashi | |
| 2022/0078365 | A1 | 3/2022 | Xu et al. | |
| 2022/0102403 | A1 * | 3/2022 | Ma | H10F 39/8037 |
| 2022/0141403 | A1 | 5/2022 | Mandelli et al. | |
| 2022/0201236 | A1 | 6/2022 | Gao et al. | |
| 2022/0360730 | A1 * | 11/2022 | Fujita | H10F 39/8033 |
| 2023/0007207 | A1 | 1/2023 | Xiao et al. | |
| 2023/0008577 | A1 | 1/2023 | Niwa | |
| 2023/0020850 | A1 | 1/2023 | Jun et al. | |
| 2023/0217119 | A1 | 7/2023 | Lee et al. | |
| 2023/0239595 | A1 * | 7/2023 | Inada | H04N 25/40 348/207.99 |
| 2023/0282667 | A1 | 9/2023 | Kim | |
| 2023/0283928 | A1 | 9/2023 | Gao et al. | |
| 2023/0308056 | A1 | 9/2023 | Choi et al. | |
| 2023/0336882 | A1 * | 10/2023 | Sohn | H04N 25/11 |
| 2023/0362518 | A1 | 11/2023 | Shiina et al. | |
| 2024/0015414 | A1 | 1/2024 | Mabuchi et al. | |
| 2024/0031697 | A1 | 1/2024 | Mostafalu et al. | |
| 2024/0073557 | A1 | 2/2024 | Suess et al. | |
| 2024/0214708 | A1 | 6/2024 | Finateu et al. | |
| 2024/0267644 | A1 | 8/2024 | Mandelli et al. | |
| 2024/0340552 | A1 | 10/2024 | Niwa et al. | |
| 2024/0380364 | A1 | 11/2024 | Choi et al. | |
| 2025/0008236 | A1 | 1/2025 | Oyama et al. | |
| 2025/0016465 | A1 | 1/2025 | Hunt et al. | |
| 2025/0052901 | A1 | 2/2025 | Harada et al. | |
| 2025/0089384 | A1 | 3/2025 | Nakamura | |
| 2025/0159374 | A1 | 5/2025 | Sato et al. | |
| 2025/0193516 | A1 | 6/2025 | Lee et al. | |
| 2025/0193538 | A1 | 6/2025 | Suess et al. | |
| 2025/0193541 | A1 | 6/2025 | Suess et al. | |
| 2025/0193550 | A1 | 6/2025 | Suess et al. | |
| 2025/0194271 | A1 * | 6/2025 | Suess | H10F 39/8053 |
| 2025/0209572 | A1 | 6/2025 | Zhao et al. | |
| 2025/0358548 | A1 | 11/2025 | Honda | |
| 2025/0359386 | A1 * | 11/2025 | Ma | H04N 25/78 |

FOREIGN PATENT DOCUMENTS

| | | | |
|---|---|---|---|
| WO | 2023186544 | A1 | 10/2023 |
| WO | 2024018812 | A1 | 1/2024 |
| WO | 2024127912 | A1 | 6/2024 |
| WO | 2024160446 | A1 | 8/2024 |

OTHER PUBLICATIONS

U.S. Appl. No. 19/330,257, entitled: "Hybrid CIS/EVS Image Sensor Supporting PDAF in Multiple Operating Modes," filed Sep. 16, 2025, pp all.

U.S. Appl. No. 19/330,397, entitled: "Image Sensors Supporting Different Gain Levels for Different Pixels," filed Sep. 16, 2025, pp all.

U.S. Appl. No. 19/352,777, entitled: "Reconfigurable Hybrid Event-Based Vision Sensor and Cmos Image Sensor" filed Oct. 8, 2025, pp all.

Brandli, et al., "A 240×180 130 dB 3 US Latency Global Shutter Spatiotemporal Vision Sensor", IEEE Journal of Solid-State Circuits, vol. 49, No. 10, Oct. 2014, pp. 2333-2341.

Chen, Shoushun, "Development of Event-based Sensor and Applications", Omnivision Sensor Solutions. Jun. 2021, pp. 1-17.

Guo, et al., "A 3-Wafer-Stacked Hybrid 15MPixel CIS + 1MPixel EVS with 4.6GEvent/s Readout, In-Pixel TDC and On-Chip ISP and ESP Function", ISSCC 2023, Session 5, Image Sensors 5.1, Feb. 20, 2023, p. 1-3.

Kodama, et al., "1.22μm 35.6Mpixel RGB Hybrid Event-Based Vision Sensor with 4.88um-Pitch Event Pixels and up to 10K Event Frame Rate by Adaptive Control on Event Sparsity", ISSCC, Feb. 20, 2023, Session 5, Image Sensors, 5.2. pp. 1-3.

Li, et al., "Design of an RGBW color VGA rolling and global shutter dynamic and active-pixel vision sensor", 2015 IEEE International Symposium on Circuits and Systems (ISCAS), Lisbon, Portugal, 2015, pp. 718-721, doi: 10.1109/ISCAS.2015.7168734.

Niwa, et al., "A 2.97μm-Pitch Event-Based Vision Sensor with Shared Pixel Front-End Circuitry and Low-Noise Intensity Readout Mode", ISSCC 2023, Session 5 Image Sensors, 5.3, Feb. 20, 2023, pp. 1-3.

Posch, et al., "An asynchronous time-based image sensor", 2008 IEEE International Symposium on Circuits and Systems (ISCAS), Seattle, WA, USA, 2008, pp. 2130-2133, doi: 10.1109/ISCAS.2008.4541871.

(56) References Cited

OTHER PUBLICATIONS

Extended European Search Report received in EP App No. 25209192.1 dated Mar. 31, 2025, pp all.
Extended European Search Report received in EP App No. 25209189.7 dated Mar. 31, 2026, pp all.
Notice of Allowance received in U.S. Appl. No. 18/919,214 dated Apr. 14, 2026, pp all.
U.S. Appl. No. 18/982,869, entitled: "Hybrid CIS/EVS Image Sensor Providing High EVS Resolution," filed Dec. 16, 2024, pp all.
Non-Final Office Action received in U.S. Appl. No. 18/918,591 dated Jan. 23, 2026, pp all.
Non-Final Office Action received in U.S. Appl. No. 18/919,325 dated Feb. 12, 2026, pp all.
Non-Final Office Action received in U.S. Appl. No. 18/919,339 dated Feb. 19, 2026, pp all.
Notice of Allowance received in U.S. Appl. No. 18/919,214 dated Feb. 5, 2026, pp all.

* cited by examiner

HYBRID IMAGING SENSOR WITH SHARED READOUT

CROSS-REFERENCE TO RELATED APPLICATIONS

The present application claims the benefit of U.S. Provisional Patent Application No. 63/608,150, filed Dec. 8, 2023, the disclosure of which is incorporated herein by reference in its entirety.

TECHNICAL FIELD

This disclosure relates generally to image sensors, and in particular but not exclusively, relates to hybrid image sensors with shared readout.

BACKGROUND

Image sensors have become ubiquitous and are now widely used in digital cameras, cellular phones, security cameras, as well as in medical, automotive, and other applications. As image sensors are integrated into a broader range of electronic devices, it is desirable to enhance their functionality, performance metrics, and the like in as many ways as possible (e.g., resolution, power consumption, dynamic range) through both device architecture design as well as image acquisition processing. The technology used to manufacture image sensors has continued to advance at a great pace. For example, the demands of higher resolution and lower power consumption have encouraged the further miniaturization and integration of these devices.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to produce digital images (e.g., image data) representing the external scene. The analog image signals on the bitlines are coupled to readout circuits, which include input stages having analog-to-digital conversion (ADC) circuits to convert those analog image signals from the pixel array into the digital image signals.

BRIEF DESCRIPTION OF THE DRAWINGS

Non-limiting and non-exhaustive embodiments of the present disclosure are described with reference to the following figures, wherein like reference numerals refer to like parts throughout the various views unless otherwise specified.

Figure 1:
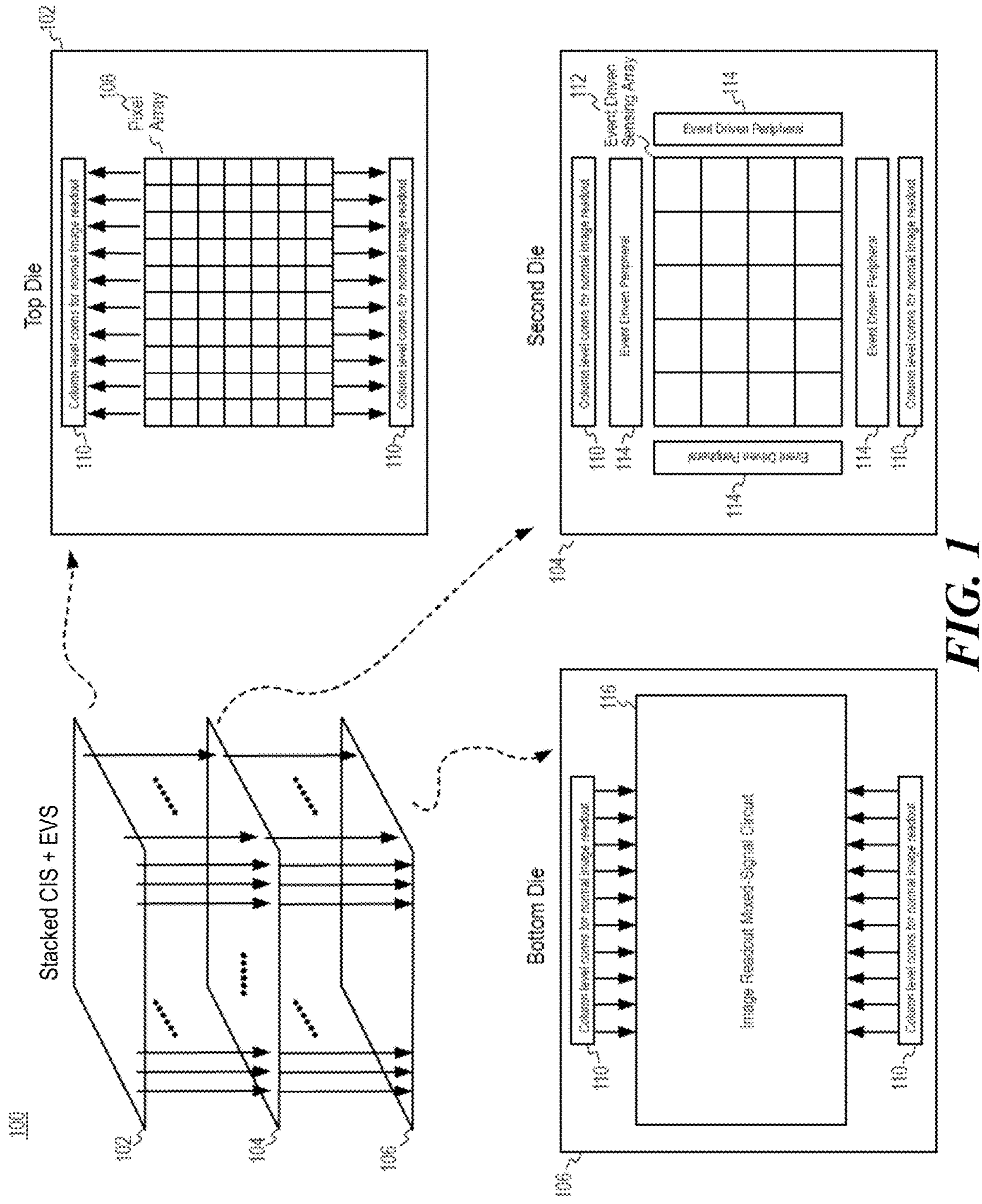
FIG. 1 illustrates one example of a stacked hybrid complementary metal oxide semiconductor (CMOS) image sensor (CIS) with event-based vision sensor functionality in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present disclosure. In addition, common but well-understood elements that are useful or necessary in a commercially feasible embodiment are often not depicted in order to facilitate a less obstructed view of these various embodiments of the present disclosure.

DETAILED DESCRIPTION

Examples directed to an imaging system with a pixel circuit providing simultaneous hybrid functionality with shared readout are disclosed. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail in order to avoid obscuring certain aspects.

Reference throughout this specification to "one example" or "one embodiment" means that a particular feature, structure, or characteristic described in connection with the example is included in at least one example of the present disclosure. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "over," "under," "above," "upper," "top," "bottom," "left," "right," "center," "middle," and the like, may be used herein for case of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is rotated or turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when an element is referred to as being "between" two other elements, it can be the only element between the two other elements, or one or more intervening elements may also be present.

It will be further understood that, although the terms first, second, third, etc., may be used herein to describe various elements, these elements should not be limited by these terms and should not be used to determine the process sequence or formation order of associated elements. Unless indicated otherwise, these terms are merely used to distinguish one element from another element. Thus, a first element discussed below could be termed a second element without departing from the teachings of the disclosed embodiments.

It will be also understood that, color filter of a color refers to an optical filter having a particular color photoresponse. A particular color photoresponse may have high transmission efficiency to certain portions of the electromagnetic spectrum while simultaneously attenuating or blocking light in other portions of the spectrum. For example, a color filter of blue has high selectivity to portion of light having wavelength ranging from 450 nm to 495 nm, a color filter of green has high selectivity to portion of light having wavelength ranging from 500 to 570 nm, and a color filter of red has high selectivity to portion of light having wavelength ranging from 620 to 750 nm.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

As will be discussed, various examples of an imaging system with a pixel circuit providing simultaneous hybrid functionality (e.g., simultaneous image/video capturing and event driven sensing capabilities) with shared readout are disclosed. Although normal image/video sensors offer great image and/or video capturing capabilities, one of the limitations with normal image/video sensors is that normal image sensors do not provide ultra-high frame rates and ultra-high speed capture capabilities that may be useful in a variety of applications such as machine vision, gaming, and artificial intelligence sensing areas. Attempts to provide typical image/video sensors with such ultra-high frame rates and ultra-high speed capabilities have resulted in compromised solutions that provide poor quality image captures compared to their normal image sensor counterparts.

It is appreciated that circuit designs in accordance with the teachings of the present disclosure address at least some of the issues discussed above. For example, an image sensor disclosed herein can operate in a hybrid mode in which the image sensor simultaneously provides great image and video capture capabilities using a first subset of pixels, and senses events (e.g., change in intensity) at ultra-high frame rates and at ultra-high speeds from pixel using a second subset of pixels for a wide variety of event driven (or other) applications. Moreover, pixels belonging to the same subset can be coupled together to efficiently provide low-noise shared or binned readout, which can improve sensitivity and enable faster frame rates.

Thus, as will be shown and described in the various examples below, an example pixel circuit includes a pixel array and a color filter array disposed over the pixel array. The pixel array includes a plurality of pixels arranged in rows and columns, and each pixel includes (i) four photodiodes configured to photogenerate image charge in response to incident light, (ii) a floating diffusion coupled to receive the image charge from the four photodiodes, and (iii) four transfer transistors coupled between corresponding ones of the photodiodes and the floating diffusion to transfer the image charges from the respective photodiodes to the floating diffusion. The color filter array includes a plurality of color filters each having one of a plurality of colors and disposed over at least one of the pixels. Each individual color filter is configured to have high sensitivity to light with wavelength within a light spectrum section of a corresponding color (e.g., red, blue, green), and low sensitivity to light with wavelength outside the light spectrum region of the corresponding color. Each of the plurality of pixels is coupled to a first readout circuit, and the plurality of pixels includes (i) a first subset of the pixels not coupled to a second readout circuit and (ii) a second subset of the pixels coupled to the second readout circuit. Floating diffusions of two diagonally arranged pixels are coupled together, and the two diagonally arranged pixels coupled together are disposed underneath color filters of a same color.

To illustrate, FIG. 1 illustrates one example of a stacked hybrid complementary metal oxide semiconductor (CMOS) image sensor (CIS) with event-based vision sensor (EVS) system 100 in accordance with the teachings of the present disclosure. As shown in the depicted example, the stacked CIS with EVS system 100 includes a first die 102, a second die 104, and a third die 106 that are stacked and coupled together in a stacked chip scheme. In various examples, the first die 102, the second die 104, and the third die 106 are semiconductor dice that include a suitable semiconductor material such as silicon. In the example, the first die 102, which may also be referred to as the top die 102 of the stacked CIS with EVS system 100, includes a pixel array 108. The third die 106, which may also be referred to as the bottom die 106 of the stacked CIS with system 100, includes an image readout circuit 116, which may also be referred to as image readout mixed-signal circuitry. The image readout circuit 116 can be coupled to the pixel array 108 of the top die 102 through column level connections for normal image readout 110. In various examples, the column level connections for normal image readout 110 are implemented from column bitlines of the pixel array 108 with through silicon vias (TSVs) that extend between the top die 102 and the bottom die 106, and are routed through the second die 104.

In various examples, the pixel array 108 is a two-dimensional (2D) array including a plurality of pixel cells (also referred to as "pixels") that each includes a photodiode exposed to incident light. As illustrated in the depicted example, the pixels are arranged into rows and columns to acquire image data of a person, place, object, etc., which can then be used to render images and/or video of a person, place, object, etc. As discussed further herein, a first fraction of the pixels are CMOS image sensor (CIS) pixels, and a second fraction of the pixels are hybrid CIS/event-based vision sensor (EVS) pixels. In the example, each CIS pixel can be configured to photogenerate image charge in response to the incident light. After each CIS pixel has acquired its image charge, the corresponding analog image charge data is read out by the image readout circuit 116 in the bottom die 106 through the column bit lines. In various examples, the image charge from each row of pixel array 108 may be read out in parallel through column bit lines by the image readout circuit 116.

In various examples, the image readout circuit 116 in the bottom die 106 includes amplifiers, analog to digital converter (ADC) circuitry, associated analog support circuitry, associated digital support circuitry, etc., for normal image readout and processing. In some examples, image readout circuit 116 may also include event driven readout circuitry, which will be described in greater detail below. In operation, the photogenerated analog image charge signals are read out from the pixel cells of pixel array 108, amplified, and converted to digital values in the image readout circuit 116. In some examples, image readout circuit 116 may read out a row of image data at a time. In other examples, the image readout circuit 116 may read out the image data using a variety of other techniques (not illustrated), such as a serial readout or a full parallel readout of all pixels simultaneously. The image data may be stored or even manipulated by applying post image effects (e.g., crop, rotate, remove red eye, adjust brightness, adjust contrast, and the like).

In the depicted example, the second die 104, which may also be referred to as the middle die 104 of the stacked CIS with EVS system 100, includes an event driven sensing array 112 that is coupled to the pixel array 108 in the top die 102. In various examples, the event driven sensing array 112 is coupled to the pixels of the pixel array 108 through pairs of hybrid bonds between the top die 102 and the middle die 104. In one example, the event driven sensing array 112 includes an array of event driven circuits. As will be discussed, in one example, each one of the event driven circuits in the event driven sensing array 112 is coupled to a plurality of pixels of the pixel array 108 through corresponding pairs of hybrid bonds between the top die 102 and the middle die 104 to asynchronously detect events that occur in the light that is incident upon the pixel array 108 in accordance with the teachings of the present disclosure.

In some embodiments, the second fraction of the pixels, namely the hybrid CIS/EVS pixels, can be selectively coupled to the event driven readout circuits of the event driven sensing array 112. When operated as EVS pixels, the photosensors of the hybrid CIS/EVS pixels can be used to track changes in the intensity of light incident on the photosensors from an external scene. In particular, the photosensors can photogenerate image charge (electrons or holes) or photocurrent in response to the incident light from the external scene. The photogenerated image can then be provided, via an EVS connection such as a hybrid bond, to a coupled event driven circuit of the event driven sensing array 112. In some embodiments, the event driven circuit includes (i) a photocurrent-to-voltage converter coupled to the photosensor to convert photocurrent generated by the photosensor to a voltage; and (ii) a filter amplifier coupled to the photocurrent-to-voltage converter to generate a filtered and amplified signal in response to the voltage received from the photocurrent-to-voltage converter. The event driven circuit can further include a threshold comparison circuit to determine and generate event detection signals in response to events asynchronously detected in incident light received from the external scene. For example, the threshold comparison circuit may generate an event detection signal when a detected change in the pixel signal at the output of the filter amplifier relative to a reference pixel signal is greater than a predetermined voltage threshold value. It is appreciated that the described event driven readout circuit is one example implementation to read out event signals. Various implementations for readout circuitry and readout schemes for event vision sensor pixels are well known. Thus, details on circuitry and readout techniques for event driven circuits are largely omitted here for the sake of brevity and to avoid obscuring aspects of the present technology.

In various examples, corresponding event detection signals are generated by the event driven circuits in the event driven sensing array 112. The event detection signals may be coupled to be received and processed by an event driven peripheral circuitry 114 which, in one example, is arranged around the periphery of the event driven sensing array 112 in the middle die 104 as shown in FIG. 1. The depicted example also illustrates the column level connections for normal image readout 110 that are routed through the middle die 104 between the top die 102 and the bottom die 106.

Figure 2:
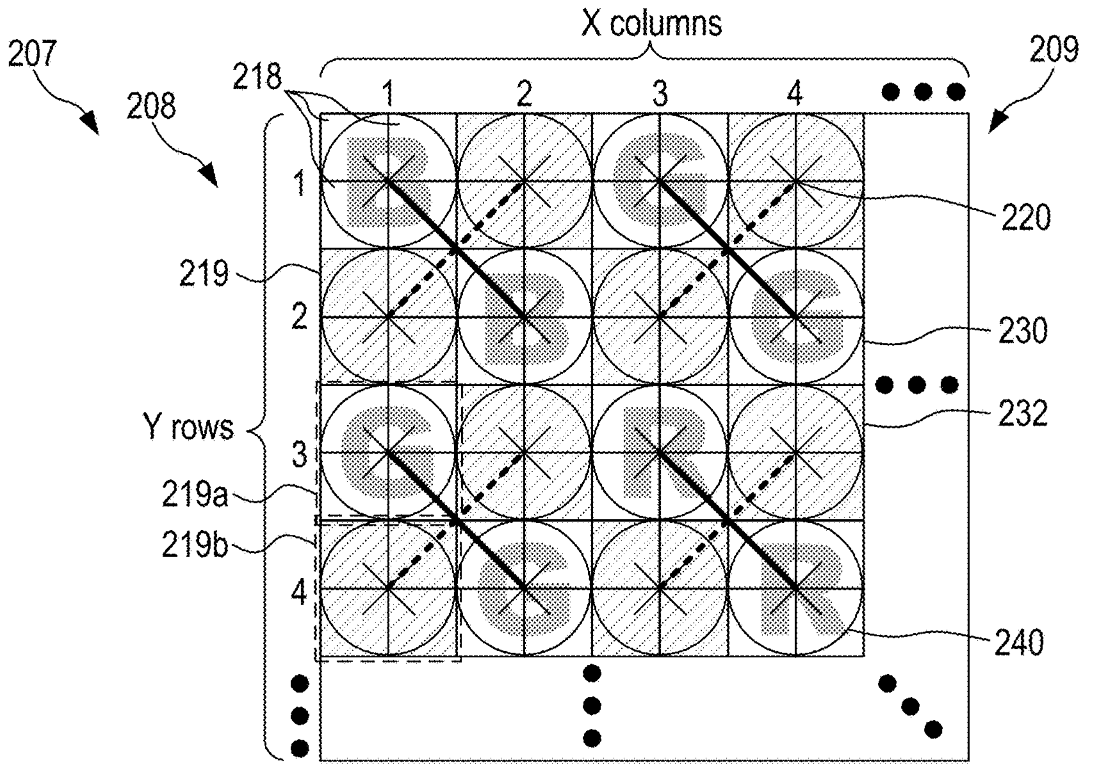
FIG. 2 illustrates one example of a pixel circuit with a quad RGBC filter array and crossed shared readout in accordance with the teachings of the present disclosure.

FIG. 2 illustrates one example of a pixel circuit 207 including a pixel array 208 and a quad color filter array such as a quad RGBC filter array 209 comprising red color filters, green color filters, blue color filters and clear color filters, and providing crossed shared readout in accordance with the teachings of the present disclosure. It is appreciated that the pixel array 208 of FIG. 2 may be an example of the pixel array 108 included in the stacked CIS with EVS system 100 as shown in FIG. 1, and that similarly named and numbered elements described above are coupled and function similarly below.

In the illustrated example, the pixel array 208 includes a plurality of pixel cells or pixels 219 arranged in Y rows and X columns. Each pixel 219 can include four subpixels 218 each including a photodiode. Thus, each of the Y rows of the pixels 219 includes two rows of subpixels 218, and each of the X columns of the pixels 219 includes two columns of subpixels 218. The four photodiodes in the four subpixels 218 are coupled together to share a floating diffusion 220 (represented as an "X" across the four adjacent subpixels 218) such that each pixel 219 includes one floating diffusion 220. Example circuitry of the pixel 219 is described in further detail below with reference to FIG. 4.

The quad RGBC filter array 209 includes a plurality of red color filters, blue color filters, green color filters (or RGB color filters) 230 disposed over pixels 219 in (i) odd-numbered rows and odd-numbered columns and (ii) even-numbered rows and even-numbered columns, and a plurality of non-RGB or clear filters 232 (or no filters or colorless filters) disposed over pixels 219 in (i) odd-numbered rows and even-numbered columns and (ii) even-numbered rows and odd-numbered columns. Moreover, RGB color filters 230 of the same color are disposed over pairs of pixels 219 arranged diagonally. For example, the pixels 219 in (i) row 1, column 1 and (ii) row 2, column 2 are disposed underneath blue color filters 230 (marked by "B"), the pixels 219 in (i) row 1, column 3, (ii) row 2, column 4, (iii) row 3, column 1, and (iv) row 4, column 2 are disposed underneath green color filters 230 (marked by "G"), the pixels 219 in (i) row 3, column 3 and (ii) row 4, column 4 are disposed underneath red color filters 230 (marked by "R"), and the remaining pixels 219 in the illustrated 4×4 grouping of pixels are disposed underneath the non-RGB or clear filters 232 (or no filters) in a checkerboard pattern.

The pixel circuit 207 can also include a plurality of microlenses 240 (illustrated as circles) disposed over the pixel array 208. In particular, the microlenses 240 are 2×2 microlenses such that each microlens 240 is disposed over a 2×2 grouping of subpixels 218 in two adjacent rows and columns, or each pixel 219. The microlenses 240 can help concentrate incident light onto the corresponding photodiodes included in the pixels 219, improving the sensitivity and overall image quality of the pixel circuit 207. The microlenses 240 can also minimize crosstalk between adjacent pixels 219, thereby enhancing the ability of the pixel circuit 207 to accurately capture fine details and colors.

Each of the pixels 219 can be coupled to a first readout circuit, such as the image readout circuit 116 shown in FIG. 1. Thus, all of the pixels 219 can be used to provide CIS information. Also, each pixel 219 can be included in either a first subset 219*a* (with no patterning in FIG. 2) or a second subset 219*b* (patterned in FIG. 2). The second subset 219*b* is a subset of the pixels 219 that contains some, but not all, of the pixels 219. In various examples, only the pixels 219 included in the second subset 219*b* are further selectively coupled to a second readout circuit, such as the event driven circuits included in the event driven sensing array 112 shown in FIG. 1. The pixels of the first subset 219*a* are thus coupled to the first readout circuit, but not the second readout circuit. In various examples, the pixels 219 included in the second subset 219*b* are configured to couple to the second readout circuit, such as the event driven circuits included in the event driven sensing array 112 shown in FIG. 1 under a specific pixel operation mode such as hybrid mode.

In FIG. 2, the pixels included in the second subset 219*b* are arranged in a checkerboard pattern such that the second subset 219*b* includes pixels 219 in (i) odd-numbered rows and even-numbered columns and (ii) even-numbered rows and odd-numbered columns. Moreover, in the illustrated embodiment, the pixels included in the second subset 219*b* are disposed underneath the non-RGB or clear filters 232 (or no filters or colorless filters). As such, 50% of the pixels 219 in the pixel array 208 are included in the second subset 219*b* in accordance with the teachings of the present disclosure. One of ordinary skill in the art will appreciate that in other examples, the positions of the pixels included in the second subset 219*b* and the pixels included in the first subset 219*a* can be flipped (e.g., the second subset 219*b* includes pixels 219 in (i) odd-numbered rows and odd-numbered columns and (ii) even-numbered rows and even-numbered columns).

Furthermore, pairs of pixels 219 are coupled together in a cross pattern. More specifically, the two floating diffusions 220 of diagonally arranged pixels 219 in each 2×2 grouping of pixels are coupled together, as shown by either solid or dashed diagonal lines each extending across two pixels 219 (e.g., one or more metal connections in metal layers), such that the two pixels 219 in each pair effectively share a floating diffusion. In other words, in each 2×2 grouping of pixels, (i) a floating diffusion of a first pixel in row N and column N is coupled to a floating diffusion of a second pixel in row N+1 and column N+1, and (ii) a floating diffusion of a third pixel in row N and column N+1 is coupled to a floating diffusion of a fourth pixel in row N+1 and column N.

Notably, because of the quad RGBC filter array 209, the two pixels coupled together to form each pair are disposed underneath either color filters 230 of the same color (e.g., blue, green, red) or non-RGB or clear filters 232 (or no filters or colorless filters). In other words, in each 2×2 grouping of pixels, (i) RGB filters 230 of a same color are disposed over a first pair of pixels diagonally arranged and included in the first subset 219*a*, wherein the floating diffusions 220 of the pixels of the first pair are coupled together, and (ii) clear filters 232 are disposed over a second pair of pixels diagonally arranged and included in the second subset 219*b*, wherein the floating diffusions 220 of the pixels of the second pair are coupled together. It is appreciated that color filters of the same color refer to color filters configured to have substantially the same spectral or color photoresponse. As discussed further herein, coupling pairs of pixels 219 in the illustrated cross pattern can efficiently provide low-noise shared or binned readout.

In various examples, the pixel circuit 207 can be operated in a first mode and a second mode. In the first mode, all of the pixels 219 are configured to couple to the corresponding first readout circuits to provide CIS information corresponding to an external scene such that the pixel circuit 207 provides an image without image quality loss compared to conventional CIS-only pixel circuits. Also, because each pair of pixels 219 has a shared floating diffusion and are disposed underneath either color filters of the same color or non-RGB or clear filters (or no filters or colorless filters), the color channels are efficiently binned to provide low-noise shared CIS information readout. In the second mode, the pixels in the first subset 219*a* are configured to couple to the corresponding first readout circuit to continue providing binned CIS information, and the pixels in the second subset 219*b* are configured to couple to the corresponding second readout circuit, to provide event detection signals (e.g., provide photocurrent for event detection functionality) and/or other non-CIS information (e.g., change in intensity or path information of moving object) in correspondence to the captured external scene. Disposing the second subset 219*b* underneath the non-RGB or clear filters 232 (or no filters or colorless filters) can help increase the photocurrent generated and/or reduce latency associated with the pixels included in the second subset 219*b*. Therefore, the second mode is a hybrid mode in which the pixel circuit 207 simultaneously provides binned CIS information and non-CIS (e.g., event detection) information.

It is appreciated that in the example N×N (e.g., 4×4) pixel circuit 207 shown in FIG. 2, when the pixels of the second subset 219*b* are configured to operate in the second mode and provide event detection signals, there are also one or more pixels of the first subset 219*a* under color filters that are configured to provide CIS information in accordance with the teachings of the present disclosure. As such, it is appreciated that at no time are all of the sampling sites of any particular color in the example 4×4 pixel circuit 207 sacrificed for EVS functionality, for example at least under a second mode (or hybrid mode) in accordance with the teachings of the present disclosure. In other words, for each pixel of the second subset 219*b* providing event detection signals, there is a corresponding pixel of the first subset 219*a* that is disposed under a color filter in the example 4×4 pixel circuit 207 in accordance with the teachings of the present disclosure.

Figure 3:
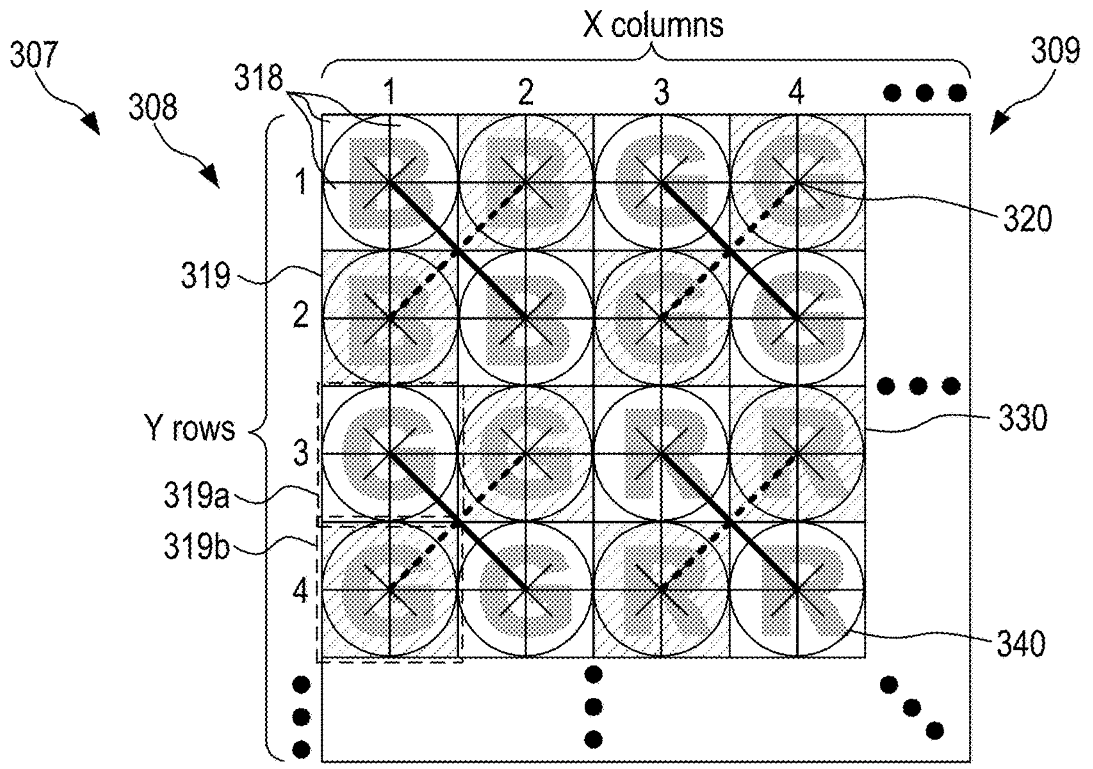
FIG. 3 illustrates one example of a pixel circuit with a quad Bayer filter array and crossed shared readout in accordance with the teachings of the present disclosure.

FIG. 3 illustrates one example of a pixel circuit 307 including a pixel array 308 and a quad Bayer filter array 309, and providing crossed shared readout in accordance with the teachings of the present disclosure. It is appreciated that the pixel array 308 of FIG. 3 may be an example of the pixel array 108 included in the stacked CIS with EVS system 100 as shown in FIG. 1, and that similarly named and numbered elements described above are coupled and function similarly below.

In the illustrated example, the pixel array 308 includes a plurality of pixel cells or pixels 319 arranged in Y rows and X columns. Each pixel 319 can include four subpixels 318 each including a photodiode. The four photodiodes in the four subpixels 318 are coupled together to share a floating diffusion 320 (represented as an "X" across the four adjacent subpixels 318) such that each pixel 319 includes one floating diffusion 320. Example circuitry of the pixel 319 is described in further detail below with reference to FIG. 4.

The quad Bayer filter array 309 includes a plurality of color filters 330 disposed over pixels 319 such that color filters 330 of the same color are disposed over a 2×2 grouping of pixels 319. For example, the pixels 319 in rows 1-2 and columns 1-2 are disposed underneath blue color filters 330 (marked by "B"), the pixels 319 in (i) rows 1-2 and columns 3-4, and (ii) rows 3-4 and columns 1-2 are disposed underneath green color filters 330 (marked by "G"), and the pixels 319 in rows 3-4 and columns 3-4 are disposed underneath red color filters 330 (marked by "R").

The pixel circuit 307 can also include a plurality of microlenses 340 (illustrated as circles) disposed over the pixel array 308. In particular, the microlenses 340 are 2×2 microlenses such that each microlens 340 is disposed over a 2×2 grouping of subpixels 318 in two adjacent rows and columns, or each pixel 319. The microlenses 340 can help concentrate incident light onto the photodiodes included in the pixels 319, improving the sensitivity and overall image quality of the pixel circuit 307. The microlenses 340 can also minimize crosstalk between adjacent pixels 319, thereby enhancing the ability of the pixel circuit 307 to accurately capture fine details and colors.

Each of the pixels 319 can be coupled to a first readout circuit, such as the image readout circuit 116 shown in FIG. 1. Thus, all of the pixels 319 can be used to provide CIS information. Also, each pixel 319 can be included in either a first subset 319*a* (with no patterning in FIG. 3) or a second subset 319*b* (patterned in FIG. 3). The second subset 319*b* is a subset of the pixels 319 that contains some, but not all, of the pixels 319. In various examples, only the pixels 319 included in the second subset 319*b* are coupled to a second readout circuit, such as the event driven circuits included in the event driven sensing array 112 shown in FIG. 1. The pixels of the first subset 319*a* are thus coupled to the first readout circuit, but not the second readout circuit. In various examples, the pixels 319 included in the second subset 319*b* are configured to couple to the second readout circuit, such as the event driven circuits included in the event driven sensing array 112 shown in FIG. 1 under a specific pixel operation mode such as hybrid mode.

In FIG. 3, the pixels included in the second subset 319*b* are arranged in a checkerboard pattern such that the second subset 319*b* includes pixels 319 in (i) odd-numbered rows and even-numbered columns and (ii) even-numbered rows and odd-numbered columns. As such, 50% of the pixels 319 in the pixel array 308 are included in the second subset 319*b* in accordance with the teachings of the present disclosure. One of ordinary skill in the art will appreciate that in other examples, the positions of the pixels included in the second subset 319*b* and the pixels included in the first subset 319*a* can be flipped (e.g., the second subset 319*b* includes pixels 319 in (i) odd-numbered rows and odd-numbered columns and (ii) even-numbered rows and even-numbered columns).

Furthermore, pairs of pixels 319 are coupled together in a cross pattern. More specifically, the two floating diffusions 320 of diagonally arranged pixels 319 in each 2×2 grouping of pixels are coupled together, as shown by either solid or dashed diagonal lines each extending across two pixels 319 (e.g., one or more metal connections), such that the two pixels 319 in each pair effectively share a floating diffusion. In other words, in each 2×2 grouping of pixels, (i) a floating diffusion of a first pixel in row N and column N is coupled to a floating diffusion of a second pixel in row N+1 and column N+1, and (ii) a floating diffusion of a third pixel in row N and column N+1 is coupled to a floating diffusion of a fourth pixel in row N+1 and column N.

Notably, because of the quad Bayer filter array 309, the two pixels coupled together to form each pair are disposed underneath color filters 330 of the same color (e.g., blue, green, red). In other words, color filters 330 of a same color are disposed over a 2×2 grouping of pixels, and each 2×2 grouping of pixels includes (i) a first pair of diagonally arranged pixels whose floating diffusions are coupled together and (ii) a second pair of diagonally arranged pixels whose floating diffusions are coupled together. As discussed further herein, coupling pairs of pixels 319 in the illustrated cross pattern can efficiently provide low-noise shared or binned readout.

In various examples, the pixel circuit 307 can be operated in a first mode and a second mode. In the first mode, all of the pixels 319 are configured to couple to the corresponding first readout circuits to provide CIS information corresponding to an external scene such that the pixel circuit 307 provides an image without image quality loss compared to conventional CIS-only pixel circuits. Also, because each pair of pixels 319 has a shared floating diffusion and are disposed underneath color filters of the same color, the color channels are efficiently binned to provide low-noise shared CIS information readout. In the second mode, the pixels in the first subset 319*a* are configured to couple to corresponding first readout circuit to continue providing binned CIS information, and the pixels in the second subset 319*b* are configured to couple to corresponding second readout circuit to provide event detection signals (e.g., provide photocurrent for event detection functionality) and/or other non-CIS information (e.g., change in intensity or movement of an object) in correspondence to the captured external scene. Because the pixels in the second subset 319*b* are disposed under the color filters 330, the non-CIS information can be provided in combined color information of red color (R), green color (G), green color (G), blue color (B) (e.g., R+G+G+B or gray), which may result in reduced sensitivity for event detection (or other functionality) in the second mode, but may provide improved image quality in the first mode. Therefore, the second mode is a hybrid mode in which the pixel circuit 307 simultaneously provides binned CIS information and non-CIS (e.g., event detection) information.

It is appreciated that in the example N×N (e.g., 4×4) pixel circuit 307 shown in FIG. 3, when the pixels of the second subset 319*b* are configured to operate in the second mode and provide event detection signals, there are also one or more pixels of the first subset 319*a* under color filters that are configured to provide CIS information in accordance with the teachings of the present disclosure. As such, it is appreciated that at no time are all of the sampling sites of any particular color in the example 4×4 pixel circuit 307 sacrificed for EVS functionality in accordance with the teachings of the present disclosure. In other words, for each pixel of the second subset 319*b* providing event detection signals, there is a corresponding pixel of the first subset 319*a* that is disposed under a color filter in the example 4×4 pixel circuit 307 in accordance with the teachings of the present disclosure.

Figure 4:
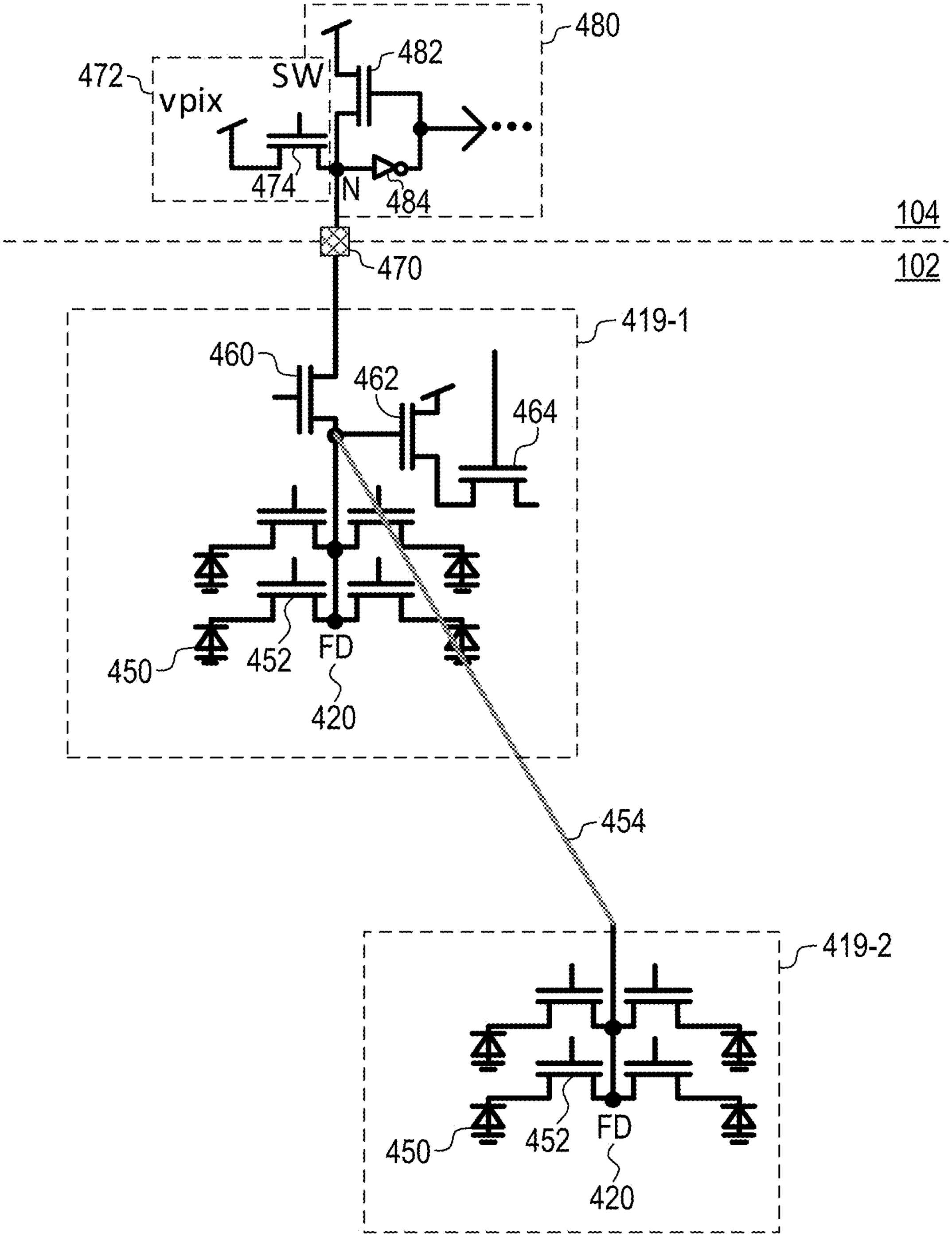
FIG. 4 illustrates one example of a pixel pair coupled to a mode select switch circuit in accordance with the teachings of the present disclosure.

FIG. 4 illustrates one example of a pixel pair coupled to a mode select switch circuit 472, which is coupled to a second readout circuit 480 in accordance with the teachings of the present disclosure. It is appreciated that the pixel pair of FIG. 4 may be an example pair of the pixels 219 and 319 included in the pixel circuits 207 and 307 as shown in FIGS. 2 and 3, and that similarly named and numbered elements described above are coupled and function similarly below.

The pixel pair includes a first pixel 419-1 and a second pixel 419-2 (collectively or individually referred to as "the pixel pair 419" or "the pixel 419," respectively). Each of the first and second pixels 419-1, 419-2 can include four photodiodes 450, a floating diffusion (FD) 420, and four transfer transistors 452 coupled between the FD 420 and corresponding ones of the four photodiodes 450. Also, the first pixel 419-1, but not the second pixel 419-2, further includes a reset transistor 460, a source follower transistor 462, and a row select transistor 464. A gate terminal of the source follower transistor 462 can be coupled to the FD 420, and the row select transistor 464 can be coupled to the source follower transistor 462 and a bitline (not illustrated). The reset transistor 460 can be coupled to the FD 420. Referring back to both pixels 419, each photodiode 450 can be configured to photogenerate an image charge in response to incident light. Each FD 420 can be coupled to receive the image charges from the four photodiodes 450 of the same pixel 419. Each transfer transistor 452 can be configured to transfer the image charge from the corresponding photodiode to the FD 420 of the same pixel 419.

In the depicted example, the mode select switch circuit 472 can include a first transistor 474 that is coupled between a node N and a voltage source vpix. In the depicted example, the node N is coupled to the second readout circuit 480, which in the example is part of one of the event driven circuits included in the event driven sensing array 112 shown in FIG. 1. In the depicted example, a photocurrent to voltage converter such as a logarithmic amplifier stage portion of the second readout circuit 480 is illustrated, which includes a second transistor 482 coupled between the node N and another voltage source, and an inverter 484 coupled to the node N. The gate of the second transistor 482 and the output of the inverter 484 can be coupled to other circuits, such as other stages (e.g., photocurrent change detection and comparator for event detection) of the second readout circuit 480 (e.g., one of the event driven circuits included in the event driven sensing array 112) discussed above. It is appreciated that the embodiments of the mode select switch circuit 472 and the logarithmic amplifier stage portion of the second readout circuit 480 illustrated in FIG. 4 are just one example, and that other circuitry can be implemented. As shown, the pixel pair 419 can be positioned on the top die 102, and the mode select switch circuit 472 and second readout circuit 480 can be positioned on the middle die 104. More specifically, the reset transistor 460 can be coupled to the node N via a pair of hybrid bond 470 or other form of bonding.

In the illustrated example, the FDs 420 of the pixel pair 419 are coupled together, such as by a metal connection 454. To operate the pixel pair 419 in the first mode to provide CIS information, the first transistor 474 of mode select switch circuit 472 may be turned ON. The image charges in the two FDs 420 are binned together via the metal connection 454, and are read out through the source follower transistor 462 and the row select transistor 464. Notably, because the image charges are binned, only the first pixel 419-1, and not the second pixel 419-2, needs to include the source follower transistor 462 and the row select transistor 464, reducing the number of components and simplifying the circuitry. To operate the pixel pair 419 in the second mode to provide non-CIS (e.g., event detection over change in intensity or movement) information, the first transistor 474 of mode select switch circuit 472 may be turned OFF. Thus, the signals from the pixel pair 419 can be sent to the second readout circuit 480 (e.g., to provide photocurrent for event detection functionality).

Figure 5:
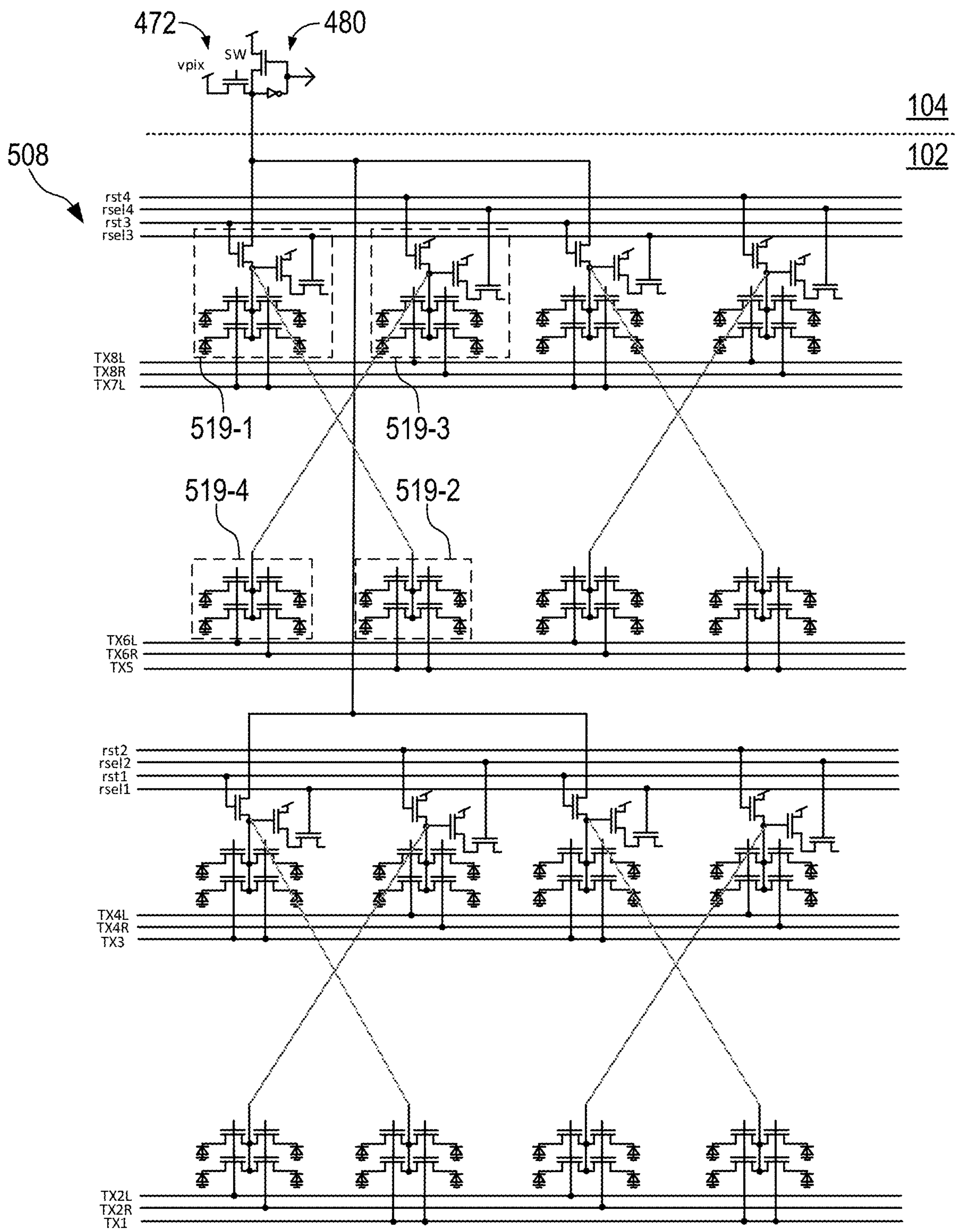
FIG. 5 illustrates one example of a pixel array coupled to a mode select switch circuit in accordance with the teachings of the present disclosure.

FIG. 5 illustrates one example of a pixel array 508 coupled to the mode select switch circuit 472 in accordance with the teachings of the present disclosure. It is appreciated that the pixel array 508 of FIG. 5 may be an example of the pixel arrays 208 and 308 included in the pixel circuits 207 and 307 as shown in FIGS. 2 and 3, and that similarly named and numbered elements described above are coupled and function similarly below.

In the illustrated example, the pixel array 508 positioned on the top die 102 includes a plurality of the pixels arranged in rows and columns. In particular, a first pixel 519-1, a second pixel 519-2, a third pixel 519-3, and a fourth pixel 519-4 are boxed in broken lines for illustrative purposes. The first pixel 519-1 and the second pixel 519-2 may be examples of the pixels included in the second subsets **219*b* or 319*b* as shown in FIGS. 2 and 3, and the third pixel 519-3 and the fourth pixel 519-4 may be examples of the pixels included in the first subsets 219*a* or 319*a* as shown in FIGS. 2 and 3. As shown, the floating diffusions of the first pixel 519-1 and the second pixel 519-2 are coupled together, for example by a metal connection, and the reset transistor of the first pixel 519-1 is coupled to the mode select switch circuit 472. Therefore, the first pixel 519-1 and the second pixel 519-2 can provide binned CIS information readout when operated in the first mode, and non-CIS information (e.g., event detection) when operated in the second mode. Also as shown, the floating diffusions of the third pixel 519-3 and the fourth pixel 519-4 are coupled together, for example by a metal connection. However, the reset transistor of the third pixel 519-3 is coupled to a voltage source, not the mode select switch circuit 472. Therefore, the third pixel 519-3 and the fourth pixel 519-4** can provide binned CIS information whether operated in the first or second mode.

Furthermore, FIG. 5 illustrates the 2×2 grouping of the first pixel 519-1, the second pixel 519-2, the third pixel 519-3, and the fourth pixel 519-4 repeating across the pixel array 508. Thus, the pixel array 508 can efficiently provide low-noise binned or shared CIS information readout when operated in the first mode, and provide hybrid CIS and non-CIS (e.g., event detection) information when operated in the second mode.

Figure 6:
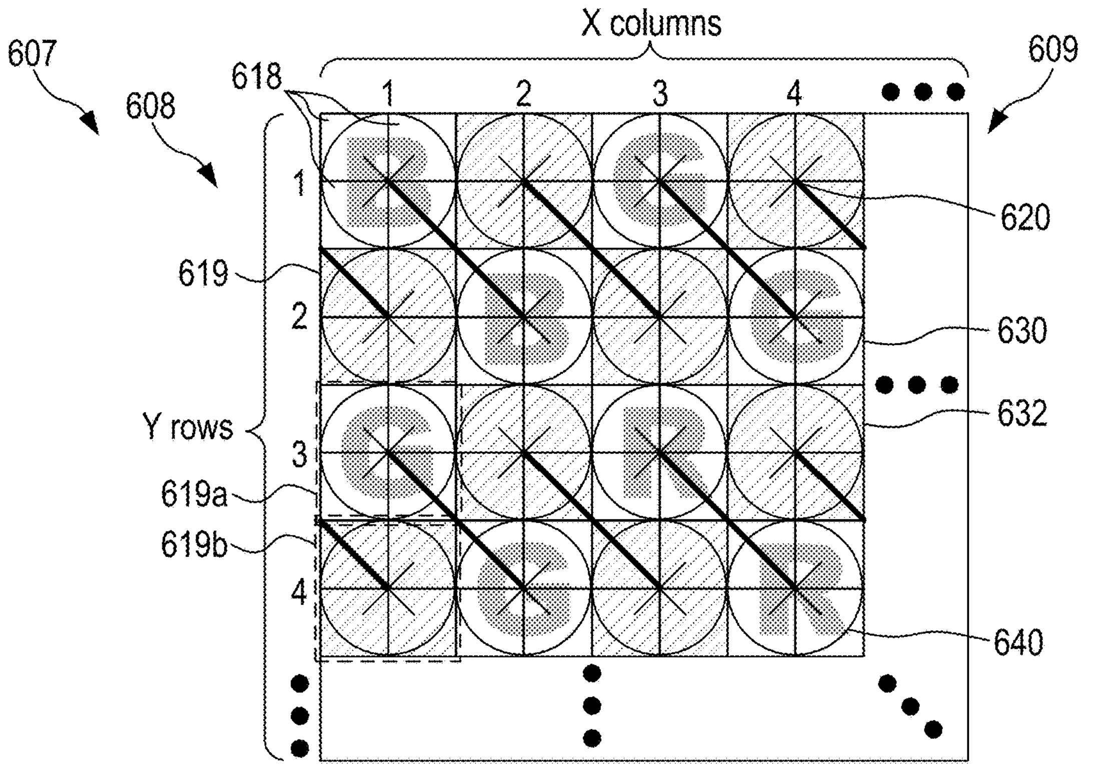
FIG. 6 illustrates one example of a pixel circuit with a quad RGBC filter array and diagonal shared readout in accordance with the teachings of the present disclosure.

FIG. 6 illustrates one example of a pixel circuit 607 including a pixel array 608 and a quad color filter array 609, and providing diagonal shared readout in accordance with the teachings of the present disclosure. It is appreciated that the pixel array 608 of FIG. 6 may be an example of the pixel array 108 included in the stacked CIS with EVS system 100 as shown in FIG. 1, and that similarly named and numbered elements described above are coupled and function similarly below.

In the illustrated example, the pixel array 608 includes a plurality of pixel cells or pixels 619 arranged in Y rows and X columns. Each pixel 619 can include four subpixels 618 each including a photodiode. The four photodiodes in the four subpixels 618 are coupled together to share a floating diffusion 620 (represented as an "X" across the four adjacent subpixels 618) such that each pixel 619 includes one floating diffusion 620. Example circuitry of the pixel 619 is described in further detail above with reference to FIG. 4.

The quad color filter array 609 includes a plurality of color filters 630 comprising red color filters, green color filters, blue color filters, and clear filters disposed over pixels 619 in (i) odd-numbered rows and odd-numbered columns and (i) even-numbered rows and even-numbered columns, and a plurality of non-RGB or clear filters 632 (or no filters or colorless filters) disposed over pixels 619 in (i) odd-numbered rows and even-numbered columns and (i) even-numbered rows and odd-numbered columns. Moreover, RGB color filters 630 of the same color are disposed over pairs of pixels 619 arranged diagonally. For example, the pixels 619 in (i) row 1, column 1 and (ii) row 2, column 2 are disposed underneath blue color filters 630 (marked by "B"), the pixels 619 in (i) row 1, column 3, (ii) row 2, column 4, (iii) row 3, column 1, and (iv) row 4, column 2 are disposed underneath green color filters 630 (marked by "G"), the pixels 619 in (i) row 3, column 3 and (ii) row 4, column 4 are disposed underneath red color filters 630 (marked by "R"), and the remaining pixels 619 in the illustrated 4×4 grouping of pixels are disposed underneath the non-RGB or clear filters 632 (or no filters or colorless filters) in a checkerboard pattern.

The pixel circuit 607 can also include a plurality of microlenses 640 (illustrated as circles) disposed over the pixel array 608. In particular, the microlenses 640 are 2×2 microlenses such that each microlens 640 is disposed over a 2×2 grouping of subpixels 618 in two adjacent rows and columns, or each pixel 619. The microlenses 640 can help concentrate incident light onto the photodiodes included in the pixels 619, improving the sensitivity and overall image quality of the pixel circuit 607. The microlenses 640 can also minimize crosstalk between adjacent pixels 619, thereby enhancing the ability of the pixel circuit 607 to accurately capture fine details and colors.

Each of the pixels 619 can be coupled to a first readout circuit, such as the image readout circuit 116 shown in FIG. 1. Thus, all of the pixels 619 can be used to provide CIS information corresponding to an external scene. Also, each pixel 619 can be included in either a first subset 619*a* (with no patterning in FIG. 6) or a second subset 619*b* (patterned in FIG. 6). The second subset 619*b* is a subset of the pixels 619 that contains some, but not all, of the pixels 619. In various examples, only the pixels 619 included in the second subset 619*b* are coupled to a second readout circuit, such as the event driven circuits included in the event driven sensing array 112 shown in FIG. 1. The pixels of the first subset 619*a* are thus coupled to the first readout circuit, but not the second readout circuit. In various examples, the pixels 619 included in the second subset 619*b* are configured to couple to the second readout circuit, such as the event driven circuits included in the event driven sensing array 112 shown in FIG. 1 under a specific pixel operation mode such as hybrid mode.

In FIG. 6, the pixels included in the second subset 619*b* are arranged in a checkerboard pattern such that the second subset 619*b* includes pixels 619 in (i) odd-numbered rows and even-numbered columns and (ii) even-numbered rows and odd-numbered columns. Moreover, in the illustrated embodiment, the pixels included in the second subset 619*b* are disposed underneath the non-RGB or clear filters 632 (or no filters or colorless filters). As such, 50% of the pixels 619 in the pixel array 608 are included in the second subset 619*b* in accordance with the teachings of the present disclosure. One of ordinary skill in the art will appreciate that in other examples, the positions of the pixels included in the second subset 619*b* and the pixels included in the first subset 619*a* can be flipped (e.g., the second subset 619*b* includes pixels 619 in (i) odd-numbered rows and odd-numbered columns and (ii) even-numbered rows and even-numbered columns).

Furthermore, pairs of pixels 619 are coupled together in a diagonal pattern. More specifically, the two floating diffusions 620 of diagonally arranged pixels 619 in two adjacent rows of pixels are coupled together, as shown by solid diagonal lines each extending across two pixels 619 (e.g., metal connections), such that the two pixels 619 in each pair effectively share a floating diffusion. Some of the solid diagonal lines extend only across one pixel 619, indicating that those pixels 619 can be coupled to pixels outside of the illustrated 4×4 grouping pixels 619. In other words, in each pair of adjacent rows, (i) a floating diffusion of a first pixel in row N and column N is coupled to a floating diffusion of a second pixel in row N+1 and column N+1, and (ii) a floating diffusion of a third pixel in row N and column N+1 is coupled to a floating diffusion of a fourth pixel in row N+1 and column N+2.

Notably, because of the quad color filter array 609, the two pixels coupled together to form each pair are disposed underneath either color filters 630 of the same color (e.g., blue, green, red) or non-RGB or clear filters 632 (or no filters or colorless filters). In other words, in each pair of adjacent rows, (i) RGB filters 630 of a same color are disposed over a first pair of pixels diagonally arranged and included in the first subset 619*a*, wherein the floating diffusions of the pixels of the first pair are coupled together, and (ii) clear filters 632 are disposed over a second pair of pixels diagonally arranged and included in the second subset 619*b*, wherein the floating diffusions of the pixels of the second pair are coupled together. Also, a first pixel of the first pair of pixels and a first pixel of the second pair of pixels are arranged in a same column, and a second pixel of the first pair of pixels and a second pixel of the second pair of pixels are arranged in different, non-adjacent columns. As discussed further herein, coupling pairs of pixels 619 of same color in the illustrated diagonal pattern can efficiently provide low-noise shared or binned readout.

In various examples, the pixel circuit 607 can be operated in a first mode and a second mode. In the first mode, all of the pixels 619 are configured to couple to the corresponding first readout circuits to provide CIS information corresponding to an external scene such that the pixel circuit 607 provides an image without image quality loss compared to conventional CIS-only pixel circuits. Also, because each pair of pixels 619 has a shared floating diffusion and are disposed underneath either color filters of the same color or non-RGB or clear filters (or no filters or colorless filters), the color channels are efficiently binned without mixing colors to provide low-noise shared CIS information readout. In the second mode, the pixels in the first subset 619*a* are configured to couple to the corresponding first readout circuit to continue providing binned CIS information, and the pixels in the second subset 619*b* are configured to couple to corresponding second readout circuit to provide event detection signals (e.g., provide photocurrent for event detection functionality) and/or other non-CIS information (e.g., change in light intensity, object movement) in correspondence to the captured external scene. Disposing the second subset 619*b* underneath the non-RGB or clear filters 632 (or no filters or colorless filters) can help increase the photocurrent generated and/or reduce latency associated with the pixels included in the second subset 619*b*. Therefore, the second mode is a hybrid mode in which the pixel circuit 607 simultaneously provides binned CIS information and non-CIS (e.g., event detection) information.

It is appreciated that in the example N×N (e.g., 4×4) pixel circuit 607 shown in FIG. 6, when the pixels of the second subset 619*b* are configured to operate in the second mode and provide event detection signals, there are also one or more pixels of the first subset 619*a* under color filters that are configured to provide CIS information in accordance with the teachings of the present disclosure. As such, it is appreciated that at no time are all of the sampling sites of any particular color in the example 4×4 pixel circuit 607 sacrificed for EVS functionality in accordance with the teachings of the present disclosure. In other words, for each pixel of the second subset **619*b* providing event detection signals, there is a corresponding pixel of the first subset 619*a* that is disposed under a color filter in the example 4×4 pixel circuit 607** in accordance with the teachings of the present disclosure.

Figure 7:
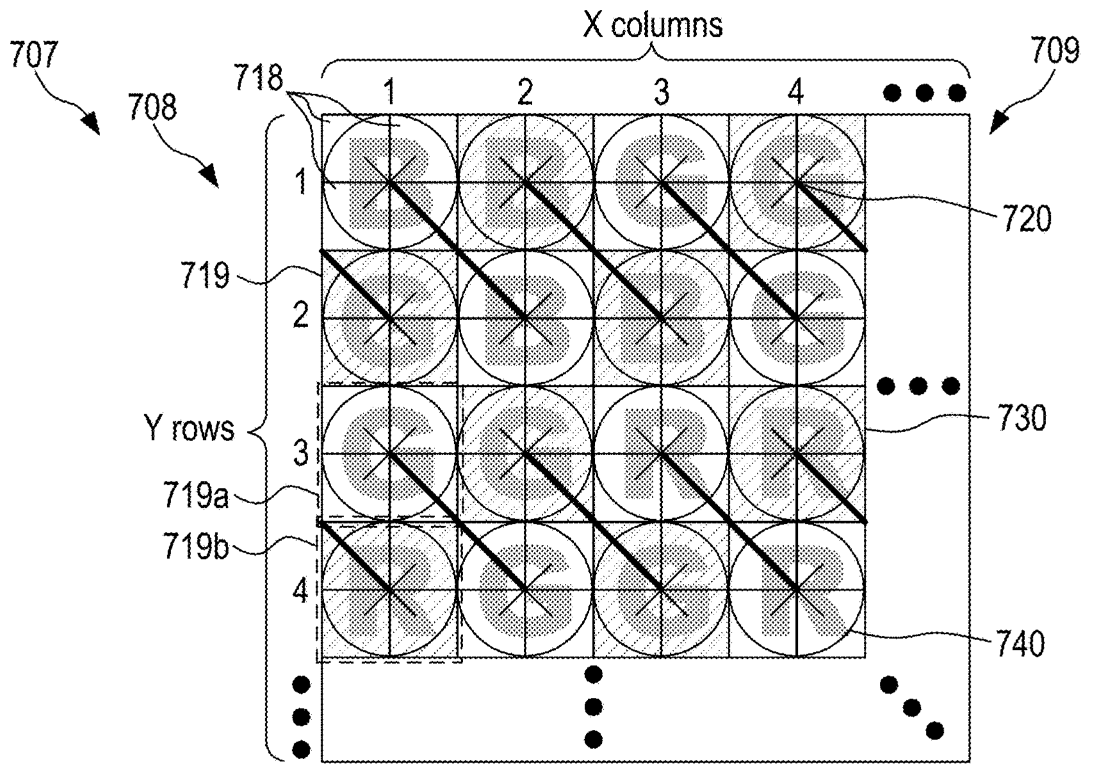
FIG. 7 illustrates one example of a pixel circuit with a zigzag quad Bayer filter array and diagonal shared readout in accordance with the teachings of the present disclosure.

FIG. 7 illustrates one example of a pixel circuit 707 including a pixel array 708 and a zigzag quad color filter array 709, and providing diagonal shared readout in accordance with the teachings of the present disclosure. It is appreciated that the pixel array 708 of FIG. 7 may be an example of the pixel array 108 included in the stacked CIS with EVS system 100 as shown in FIG. 1, and that similarly named and numbered elements described above are coupled and function similarly below.

In the illustrated example, the pixel array 708 includes a plurality of pixel cells or pixels 719 arranged in Y rows and X columns. Each pixel 719 can include four subpixels 718 each including a photodiode. The four photodiodes in the four subpixels 718 are coupled together to share a floating diffusion 720 (represented as an "X" across the four adjacent subpixels 718) such that each pixel 719 includes one floating diffusion 720. Example circuitry of the pixel 719 is described in further detail above with reference to FIG. 4.

The zigzag-binned quad color filter array 709 includes a plurality of color filters 730 comprising of red color filters, green color filters, and clear filters and the plurality of color filters 730 disposed over pixels 719 such that color filters 730 of the same color are disposed over a zigzag grouping of pixels 719. For example, the pixels 719 in (i) row 1, column 1, (ii) rows 1-2, column 2, and (iii) row 2, column 3 are disposed underneath blue color filters 730 (marked by "B"), the pixels 719 in (i) row 1, column 3, (ii) rows 1-2, column 4, (iii) rows 2-3, column 1, (iv) rows 3-4, column 2, and (v) row 4, column 3 are disposed underneath green color filters 730 (marked by "G"), and the pixels 719 in (i) row 3, column 3, (ii) rows 3-4 and column 4, and (iii) row 4, column 1 are disposed underneath red color filters 730 (marked by "R").

The pixel circuit 707 can also include a plurality of microlenses 740 (illustrated as circles) disposed over the pixel array 708. In particular, the microlenses 740 are 2×2 microlenses such that each microlens 740 is disposed over a 2×2 grouping of subpixels 718 in two adjacent rows and columns, or each pixel 719. The microlenses 740 can help concentrate incident light onto the corresponding photodiodes included in the pixels 719, improving the sensitivity and overall image quality of the pixel circuit 707. The microlenses 740 can also minimize crosstalk between adjacent pixels 719, thereby enhancing the ability of the pixel circuit 707 to accurately capture fine details and colors.

Each of the pixels 719 can be coupled to a first readout circuit, such as the image readout circuit 116 shown in FIG. 1. Thus, all of the pixels 719 can be used to provide CIS information. Also, each pixel 719 can be included in either a first subset **719*a* (with no patterning in FIG. 7) or a second subset 719*b* (patterned in FIG. 7). The second subset 719*b* is a subset of the pixels 719 that contains some, but not all, of the pixels 719. In various examples, only the pixels 719 included in the second subset 719*b* are coupled to a second readout circuit, such as the event driven circuits included in the event driven sensing array 112 shown in FIG. 1. The pixels of the first subset 719*a* are thus coupled to the first readout circuit, but not the second readout circuit. In various examples, the pixels 719 included in the second subset 719*b* are configured to couple to the second readout circuit, such as the event driven circuits included in the event driven sensing array 112 shown in FIG. 1** under a specific pixel operation mode such as hybrid mode.

In FIG. 7, the pixels included in the second subset **719*b* are arranged in a checkerboard pattern such that the second subset 719*b* includes pixels 719 in (i) odd-numbered rows and even-numbered columns and (ii) even-numbered rows and odd-numbered columns. As such, 50% of the pixels 719 in the pixel array 708 are included in the second subset 719*b* in accordance with the teachings of the present disclosure. One of ordinary skill in the art will appreciate that in other examples, the positions of the pixels included in the second subset 719*b* and the pixels included in the first subset 719*a* can be flipped (e.g., the second subset 719*b* includes pixels 719** in (i) odd-numbered rows and odd-numbered columns and (ii) even-numbered rows and even-numbered columns).

Furthermore, pairs of pixels 719 are coupled together in a diagonal pattern. More specifically, the two floating diffusions 720 of diagonally arranged pixels 719 in two adjacent rows are coupled together, as shown by solid diagonal lines each extending across two pixels 719 (e.g., one or more metal connections), such that the two pixels 719 in each pair effectively share a floating diffusion. In other words, in each pair of adjacent rows, (i) a floating diffusion of a first pixel in row N and column N is coupled to a floating diffusion of a second pixel in row N+1 and column N+1, and (ii) a floating diffusion of a third pixel in row N and column N+1 is coupled to a floating diffusion of a fourth pixel in row N+1 and column N+2.

Notably, because of the zigzag quad color filter array 709, the two pixels coupled together to form each pair are disposed underneath color filters 730 of the same color (e.g., blue, green, red). In other words, (i) RGB filters 730 of a same color are disposed over four pixels arranged in two adjacent rows and three adjacent columns, and (ii) the four pixels include a first pair of diagonally arranged pixels whose floating diffusions 720 are coupled together and a second pair of diagonally arranged pixels whose floating diffusions 720 are coupled together. As discussed further herein, coupling pairs of pixels 719 in the illustrated diagonal pattern can efficiently provide low-noise shared or binned readout.

In various examples, the pixel circuit 707 can be operated in a first mode and a second mode. In the first mode, all of the pixels 719 are configured to couple to the corresponding first readout circuits to provide CIS information corresponding to an external scene such that the pixel circuit 707 provides an image without image quality loss compared to conventional CIS-only pixel circuits. Also, because each pair of pixels 719 has a shared floating diffusion and are disposed underneath color filters of the same color, the color channels are efficiently binned without mixing colors to provide low-noise shared CIS information readout. In the second mode, the pixels in the first subset **719*a* are configured to couple to the corresponding first readout circuit to continue providing binned CIS information, and the pixels in the second subset 719*b* are configured to couple to the corresponding second readout circuit to provide event detection signals (e.g., provide photocurrent for event detection functionality) and/or other non-CIS information (e.g., change in intensity or path information of moving object) in correspondence to the captured external scene. Because the pixels in the second subset 719*b* are disposed under the RGB filters 730, the non-CIS information can be provided in R+G+G+B or gray, which may result in reduced sensitivity for event detection (or other functionality) in the second mode, but may provide improved image quality in the first mode. Therefore, the second mode is a hybrid mode in which the pixel circuit 707** simultaneously provides binned CIS information and non-CIS (e.g., event detection) information.

It is appreciated that in the example N×N (e.g., 4×4) pixel circuit 707 shown in FIG. 7, when the pixels of the second subset 719*b* are configured to operate in the second mode and provide event detection signals, there are also one or more pixels of the first subset 719*a* under color filters that are configured to provide CIS information in accordance with the teachings of the present disclosure. As such, it is appreciated that at no time are all of the sampling sites of any particular color in the example 4×4 pixel circuit 707 sacrificed for EVS functionality in accordance with the teachings of the present disclosure. In other words, for each pixel of the second subset 719*b* providing event detection signals, there is a corresponding pixel of the first subset 719*a* that is disposed under a color filter in the example 4×4 pixel circuit 707 in accordance with the teachings of the present disclosure.

Figure 8:
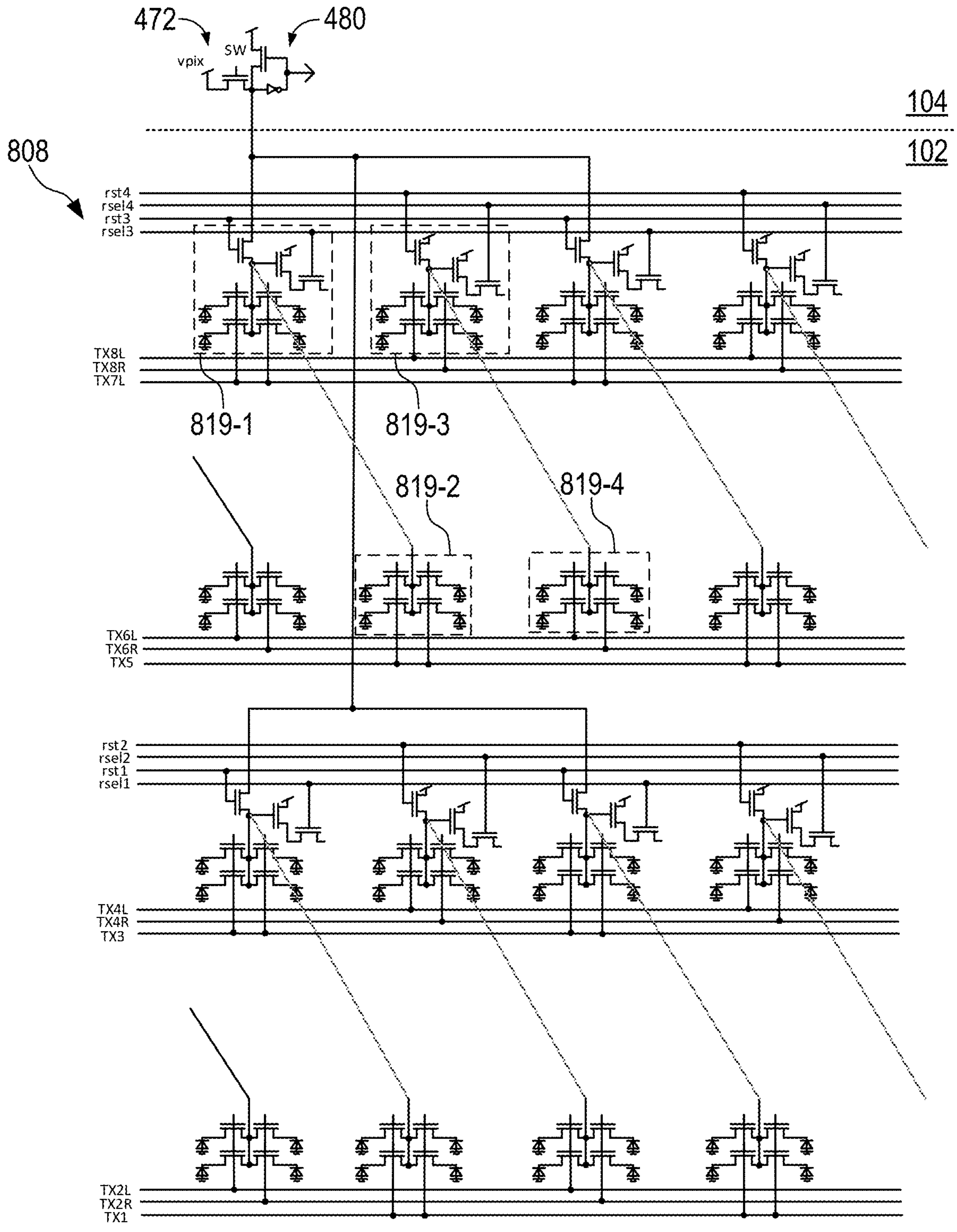
FIG. 8 illustrates another example of a pixel array coupled to a mode select switch circuit in accordance with the teachings of the present disclosure.

FIG. 8 illustrates one example of a pixel array 808 coupled to the mode select switch circuit 472 in accordance with the teachings of the present disclosure. It is appreciated that the pixel array 808 of FIG. 8 may be an example of the pixel arrays 608 and 708 included in the pixel circuits 607 and 707 as shown in FIGS. 6 and 7, and that similarly named and numbered elements described above are coupled and function similarly below.

In the illustrated example, the pixel array 808 positioned on the top die 102 includes a plurality of the pixels arranged in rows and columns. In particular, a first pixel 819-1, a second pixel 819-2, a third pixel 819-3, and a fourth pixel 819-4 are boxed in broken lines for illustrative purposes. As shown, the floating diffusions of the first pixel 819-1 and the second pixel 819-2 are coupled together, and the reset transistor of the first pixel 819-1 is coupled to the mode select switch circuit 472. Therefore, the first pixel 819-1 and the second pixel 819-2 can provide binned CIS information readout when operated in the first mode, and non-CIS information (e.g., event detection) when operated in the second mode. Also as shown, the floating diffusions of the third pixel 819-3 and the fourth pixel 819-4 are coupled together. However, the reset transistor of the third pixel 819-3 is coupled to a voltage source, not the mode select switch circuit 472. Therefore, the third pixel 819-3 and the fourth pixel 819-4 can provide binned CIS information whether operated in the first or second mode.

Also as shown, two transfer transistors arranged vertically in each pixel 819 share the same transfer transistor signal, which can reduce the number of required interconnects. Furthermore, FIG. 8 illustrates the zigzag grouping of the first pixel 819-1, the second pixel 819-2, the third pixel 819-3, and the fourth pixel 819-4 repeating across the pixel array 808. Thus, the pixel array 808 can efficiently provide low-noise binned or shared CIS information readout when operated in the first mode, and provide hybrid CIS and non-CIS (e.g., event detection) information when operated in the second mode.

It is appreciated that the pixel circuits illustrated herein and described above are merely examples illustrative of certain features of the present disclosure, and that other pixel circuits are within the scope of the present disclosure. For example, a pixel circuit can include pixels structured and arranged to provide phase detection information (e.g., half-shield PDAF, microlens phase detection, DPD, QPD), rolling shutter and global shutter, etc. A pixel circuit can also include microlenses of different dimensions (e.g., 1×2) disposed over the pixel array. In various examples, the second subset can include different proportions of the pixels in the pixel array, such as 1/16, 2/16, 3/16, 4/16, 5/16, 6/16, 7/16, or other proportions. In yet other examples, all of the pixels are coupled to the second readout circuit without a distinction between a second subset and a first subset of the pixels.

In some cases, arranging the pixels included in the second subset in a checkerboard pattern can be preferred due to the manner in which most image sensor systems are used. For example, image sensors (e.g., smartphone cameras) are often held either horizontally or vertically such that horizons or edges (e.g., of walls, doors, windows, etc.) land on a single row or column. If (i) an imaging system is operating in the second (e.g., hybrid) mode, (ii) the pixels included in the second subset cover an entire row or column, and (iii) the incident light from a horizon or edge lands on the row or column occupied entirely by the pixels included in the second subset, the imaging system may be unable to sharply capture that horizon or edge due to the lack of CIS pixels in that row or column. On the other hand, a checkerboard pattern ensures that each row and column includes CIS pixels at all times, regardless of the mode in which the imaging system is operating, to capture those horizons or edges.

In the pixel circuits illustrated and/or described above, floating diffusions of two diagonally arranged pixels are coupled together, and the two diagonally arranged pixels coupled together are disposed underneath color filters of a same color. As also discussed above, an imaging system configured in accordance with the teachings of the present disclosure can be configured between a first mode, providing only CIS information without image quality loss, and a second mode, providing hybrid (e.g., simultaneous CIS and non-CIS) information. This enables the imaging system to selectively provide various types of information without sacrificing conventional imaging quality, unlike many conventional imaging systems. Also, by binning eight photodiodes, the imaging system can efficiently provide low-noise shared readout, which can also improve shrink.

CONCLUSION

The above description of illustrated examples of the disclosure, including what is described in the Abstract, is not intended to be exhaustive or to limit the disclosure to the precise forms disclosed. While specific examples of the disclosure are described herein for illustrative purposes, various modifications are possible within the scope of the disclosure, as those skilled in the relevant art will recognize.

These modifications can be made to the disclosure in light of the above detailed description. The terms used in the following claims should not be construed to limit the disclosure to the specific examples disclosed in the specification. Rather, the scope of the disclosure is to be determined entirely by the following claims, which are to be construed in accordance with established doctrines of claim interpretation.

We claim:

1. A pixel circuit, comprising:

a pixel array including a plurality of pixels arranged in rows and columns, wherein each pixel of the plurality of pixels includes:

a plurality of photodiodes configured to photogenerate image charge in response to incident light;

a floating diffusion coupled to receive the image charge from the plurality of photodiodes; and a plurality of transfer transistors coupled between corresponding ones of the photodiodes and the floating diffusion to transfer the image charges from the respective photodiodes to the floating diffusion; and a color filter array disposed over the pixel array, wherein the color filter array includes a plurality of color filters each having one of a plurality of colors and disposed over at least one of the pixels, wherein— the plurality of pixels includes a first subset of the pixels coupled to a first readout circuit but not coupled to a second readout circuit, and a second subset of the pixels selectively coupled to the second readout circuit, floating diffusions of two adjacent and diagonally arranged pixels of the plurality of pixels are coupled together, and the two adjacent and diagonally arranged pixels coupled together are disposed underneath color filters of a same color.

2. The pixel circuit of claim 1, wherein:

a floating diffusion of a first pixel in row N and column N is coupled to a floating diffusion of a second pixel in row N+1 and column N+1, and a floating diffusion of a third pixel in row N and column N+1 is coupled to a floating diffusion of a fourth pixel in row N+1 and column N.

3. The pixel circuit of claim 1, wherein the color filter array comprises a quad color filter array such that in each 2×2 grouping of pixels— color filters of a same color are disposed over a first pair of pixels diagonally arranged and included in the first subset of the pixels, wherein the floating diffusions of the pixels of the first pair are coupled together, and clear filters are disposed over a second pair of pixels diagonally arranged and included in the second subset, wherein the floating diffusions of the pixels of the second pair are coupled together.

4. The pixel circuit of claim 1, wherein the color filter array comprises a quad Bayer filter array such that color filters of a same color are disposed over a 2×2 grouping of pixels, and wherein each 2×2 grouping of pixels includes a first pair of diagonally arranged pixels whose floating diffusions are coupled together and a second pair of diagonally arranged pixels whose floating diffusions are coupled together.

5. The pixel circuit of claim 1, wherein in each pair of adjacent rows— a floating diffusion of a first pixel in row N and column N is coupled to a floating diffusion of a second pixel in row N+1 and column N+1, and a floating diffusion of a third pixel in row N and column N+1 is coupled to a floating diffusion of a fourth pixel in row N+1 and column N+2.

6. The pixel circuit of claim 1, wherein the color filter array comprises a quad color filter array such that in each pair of adjacent rows— color filters of a same color are disposed over a first pair of pixels diagonally arranged and included in the first subset of the pixels, wherein the floating diffusions of the pixels of the first pair are coupled together, and clear filters are disposed over a second pair of pixels diagonally arranged and included in the second subset, wherein the floating diffusions of the pixels of the second pair are coupled together, wherein a first pixel of the first pair of pixels and a first pixel of the second pair of pixels are arranged in a same column, and wherein a second pixel of the first pair of pixels and a second pixel of the second pair of pixels are arranged in different, non-adjacent columns.

7. The pixel circuit of claim 1, wherein the color filter array comprises a zigzag quad Bayer filter array such that color filters of a same color are disposed over four pixels arranged in two adjacent rows and three adjacent columns, and wherein the four pixels include a first pair of diagonally arranged pixels whose floating diffusions are coupled together and a second pair of diagonally arranged pixels whose floating diffusions are coupled together.

8. The pixel circuit of claim 1, wherein the two diagonally arranged pixels coupled together are included in a same one of the first subset of the pixels or the second subset of the pixels.

9. The pixel circuit of claim 1, wherein the pixels included in the second subset of the pixels are arranged in a checkerboard pattern.

10. The pixel circuit of claim 1, wherein the second subset of the pixels comprises 50% of the pixels included in the pixel array.

11. An imaging system, comprising:

a pixel circuit including:

a pixel array having a plurality of pixels arranged in rows and columns, wherein each pixel includes:

a plurality of photodiodes configured to photogenerate image charge in response to incident light;

a floating diffusion coupled to receive the image charge from the plurality of photodiodes; and a plurality of transfer transistors coupled between corresponding ones of the photodiodes and the floating diffusion to transfer the image charges from the respective photodiodes to the floating diffusion; and a color filter array disposed over the pixel array, wherein the color filter array includes a plurality of color filters each having one of a plurality of colors and disposed over at least one of the pixels;

a first readout circuit;

a second readout circuit, wherein the plurality of pixels includes a first subset of the pixels coupled to the first readout circuit but not coupled to the second readout circuit, and a second subset of the pixels selectivity coupled to the second readout circuit, wherein the second readout circuit is coupled to each of the pixels included in the second subset to read out a second set of data signals; and a mode select switch circuit coupled to the pixels included in the second subset of the pixels, wherein the pixels included in the second subset of the pixels are configured to provide either the first set of data signals to the first readout circuit or the second set of data signals to the second readout circuit in response to the mode select circuit, wherein floating diffusions of two adjacent and diagonally arranged pixels are coupled together, and wherein the two adjacent and diagonally arranged pixels coupled together are disposed underneath color filters of a same color.

12. The imaging system of claim 11, wherein:

a floating diffusion of a first pixel in row N and column N is coupled to a floating diffusion of a second pixel in row N+1 and column N+1, and a floating diffusion of a third pixel in row N and column N+1 is coupled to a floating diffusion of a fourth pixel in row N+1 and column N.

13. The imaging system of claim 11, wherein the color filter array comprises a quad color filter array including red color filters, blue color filters, green color filters, and clear filters such that in each 2×2 grouping of pixels— color filters of a same color are disposed over a first pair of pixels diagonally arranged and included in the first subset of the pixels, wherein the floating diffusions of the pixels of the first pair are coupled together, and clear filters are disposed over a second pair of pixels diagonally arranged and included in the second subset of the pixels, wherein the floating diffusions of the pixels of the second pair are coupled together.

14. The imaging system of claim 11, wherein the color filter array comprises a quad Bayer filter array such that color filters of a same color are disposed over a 2×2 grouping of pixels, and wherein each 2×2 grouping of pixels includes a first pair of diagonally arranged pixels whose floating diffusions are coupled together and a second pair of diagonally arranged pixels whose floating diffusions are coupled together.

15. The imaging system of claim 11, wherein in each pair of adjacent rows— a floating diffusion of a first pixel in row N and column N is coupled to a floating diffusion of a second pixel in row N+1 and column N+1, and a floating diffusion of a third pixel in row N and column N+1 is coupled to a floating diffusion of a fourth pixel in row N+1 and column N+2.

16. The imaging system of claim 11, wherein the color filter array comprises a quad color filter array including red color filters, blue color filters, green color filters, and clear filters such that in each pair of adjacent rows— red color filters, blue color filters, and green color filters of a same color are disposed over a first pair of pixels diagonally arranged and included in the first subset of the pixels, wherein the floating diffusions of the pixels of the first pair are coupled together, and clear filters are disposed over a second pair of pixels diagonally arranged and included in the second subset, wherein the floating diffusions of the pixels of the second pair are coupled together, wherein a first pixel of the first pair of pixels and a first pixel of the second pair of pixels are arranged in a same column, and wherein a second pixel of the first pair of pixels and a second pixel of the second pair of pixels are arranged in different, non-adjacent columns.

17. The imaging system of claim 11, wherein the color filter array comprises a zigzag quad Bayer filter array such that color filters of a same color are disposed over four pixels arranged in two adjacent rows and three adjacent columns, and wherein the four pixels include a first pair of diagonally arranged pixels whose floating diffusions are coupled together and a second pair of diagonally arranged pixels whose floating diffusions are coupled together.

18. The imaging system of claim 11, wherein the two diagonally arranged pixels coupled together are included in a same one of the first subset or the second subset.

19. The imaging system of claim 11, wherein the pixels included in the second subset of the pixels are arranged in a checkerboard pattern.

20. The imaging system of claim 11, wherein the second subset of the pixels comprises 50% of the pixels included in the pixel array.

* * * * *